(12) United States Patent
Rahim

(10) Patent No.: US 7,173,320 B1
(45) Date of Patent: Feb. 6, 2007

(54) HIGH PERFORMANCE LATERAL BIPOLAR TRANSISTOR

(75) Inventor: Irfan Rahim, San Jose, CA (US)

(73) Assignee: Altera Corporation, San Jose, CA (US)

(*) Notice: Subject to any disclaimer, the term of this patent is extended or adjusted under 35 U.S.C. 154(b) by 0 days.

(21) Appl. No.: 10/427,777

(22) Filed: Apr. 30, 2003

(51) Int. Cl.
- *H01L 29/00* (2006.01)
- *H01L 29/82* (2006.01)
- *H01L 43/00* (2006.01)
- *H01L 27/082* (2006.01)

(52) U.S. Cl. .................. 257/557; 257/423; 257/511; 257/525; 257/526; 257/556; 257/558; 257/559; 257/560; 257/561; 257/562; 257/575

(58) Field of Classification Search ........ 257/556–562, 257/423, 511, 525–526, 575
See application file for complete search history.

(56) References Cited

U.S. PATENT DOCUMENTS

| | | | | | |
|---|---|---|---|---|---|
| 4,965,872 | A | * | 10/1990 | Vasudev | 257/526 |
| 5,298,786 | A | * | 3/1994 | Shahidi et al. | 257/559 |
| 5,552,624 | A | * | 9/1996 | Skotnicki et al. | 257/350 |
| 5,770,881 | A | * | 6/1998 | Pelella et al. | 257/347 |
| 6,020,222 | A | * | 2/2000 | Wollesen | 438/149 |
| 6,124,618 | A | * | 9/2000 | Wong et al. | 257/370 |
| 6,246,104 | B1 | * | 6/2001 | Tsuda et al. | 257/558 |
| 6,249,031 | B1 | * | 6/2001 | Verma et al. | 257/378 |
| 6,275,059 | B1 | * | 8/2001 | Sah et al. | 324/765 |
| 6,376,897 | B2 | * | 4/2002 | Yamada et al. | 257/347 |
| 6,424,013 | B1 | * | 7/2002 | Steinhoff et al. | 257/355 |
| 6,724,066 | B2 | * | 4/2004 | Swanson et al. | 257/557 |
| 6,770,952 | B2 | * | 8/2004 | Babcock et al. | 257/565 |
| 6,794,237 | B2 | * | 9/2004 | Babcock et al. | 438/204 |
| 6,861,325 | B1 | * | 3/2005 | Pan et al. | 438/325 |
| 7,038,249 | B2 | * | 5/2006 | Suligoj et al. | 257/183 |
| 2002/0185682 | A1 | * | 12/2002 | Nandakumar et al. | 257/344 |

* cited by examiner

*Primary Examiner*—Ida M. Soward
(74) *Attorney, Agent, or Firm*—Morgan, Lewis & Bockius LLP

(57) ABSTRACT

A lateral bipolar transistor includes an emitter region, a base region, a collector region, and a gate disposed over the base region. A bias line is connected to the gate for applying a bias voltage thereto during operation of the transistor. The polarity of the bias voltage is such as to create an accumulation layer in the base under the gate. The accumulation layer provides a low-resistance path for the transistor base current, thus reducing the base resistance of the transistor.

25 Claims, 4 Drawing Sheets

HIGH PERFORMANCE LATERAL BIPOLAR TRANSISTOR

BACKGROUND OF THE INVENTION

The present invention relates generally to semiconductor devices and in particular to lateral bipolar transistors.

From early on it has been the goal of integrated-circuit development to integrate on a chip as many components as possible. Integration allows fabrication of smaller and faster systems that dissipate less power. While CMOS (complementary metal-oxide-semiconductor) technology, which has become predominant in the fabrication of integrated circuits, particularly digital circuits, allows high integration levels and low-cost fabrication, bipolar technology has re-gained intensive attention in recent time due to such advantages over CMOS devices as higher speed, higher current density, lower noise and higher cutoff frequency. One characteristic of bipolar devices that has been considered a drawback for a long time is the higher static power dissipation than in CMOS devices. However, this advantage of CMOS devices may disappear as their operating speed increases and the dynamic power dissipation of CMOS circuits becomes a significant factor.

Among bipolar transistors, vertical and lateral types can be distinguished. Vertical bipolar transistors can exhibit excellent performance; however, their fabrication requires a number of special processing steps, which makes their integration into a CMOS process a problem. Moreover, conventional vertical bipolar transistors are not very compact, thus limiting the achievable integration density. On the other hand, a lateral bipolar transistor, though typically considered as having lower performance than its vertical counterpart, is a transistor well-suited for integration into a CMOS process owing to many structural similarities between a lateral bipolar transistor and a MOSFET (metal-oxide-semiconductor field-effect transistor).

FIG. 1 depicts a conventional lateral bipolar transistor, such as known from, e.g., U.S. Pat. No. 5,567,631, which can be fabricated using a CMOS process. The transistor, designated 10, is fabricated in SOI (silicon-on-insulator) technology. In this technology, a thin single crystalline silicon layer resides on an insulating layer produced in a silicon substrate typically using a SIMOX (separation by implanted oxygen) process. The thin silicon layer serves as the active layer within which all circuit elements of an integrated circuit chip, such as transistors, diodes, capacitors, and resistors, are created. The presence of the insulator, which is usually a silicon dioxide, greatly reduces parasitic capacitances and allows easy separation and insulation of the circuit elements. In FIG. 1, reference numeral 12 designates the substrate, reference numeral 14 the insulating layer and reference numeral 16 the thin silicon-on-insulator layer.

Transistor 10 comprises spaced-apart emitter and collector regions 18, 20 as well as a base region 22 filling the space between emitter region 18 and collector region 20. Emitter region 18, base region 22 and collector region 20 are formed in lateral, juxtaposed arrangement in silicon layer 16. Emitter region 18 is a heavily doped region, whereas collector region 20 is composed of a lightly doped collector sub-region 20a and a heavily doped collector sub-region 20b. A polysilicon gate 24 overlays base region 22 and is insulated therefrom by an oxide layer 26. Gate 24 shields base region 22 during doping of silicon layer 16, thus defining the length of base region 22 as measured in a direction of distance between emitter region 18 and collector region 20. During operation of transistor 10, gate 24 has no function. Metal contacts 28, 30 for contacting emitter region 18 and collector region 20, respectively, are formed in contact holes 32 formed in a layer of silicon dioxide 34 deposited over transistor 10. Reference numeral 36 designates insulating spacers on the sidewalls of gate 24, and reference numeral 38 designates field oxide regions isolating transistor 10 from adjacent circuit structures.

As can be seen from FIG. 1, emitter region 18 and collector region 20 extend across the entire depth of silicon layer 16. This requires adoption of a side contact scheme for contacting base region 22. To this effect and as illustrated in FIG. 2, base region 22 extends beyond gate 24 in the width direction of transistor 10, thereby forming protruding end portions 40. A metal base contact 42 is formed on one of these end portions 40 of base region 22.

In bipolar transistors, the base resistance is one of the most important electrical parameters due to its critical impact on transistor performance. Achieving a low base resistance is a general goal underlying the work of transistor designers. Although the base contact 42 is close to the intrinsic part of base region 22 in the structure shown in FIGS. 1 and 2, the base resistance of transistor 10 is very high and increases with increasing device width. A large effective base width, however, is advantageous for achieving a high value of $\beta$, the common-emitter current gain expressed by $\beta = I_C/I_B$, where $I_C$ is the collector current and $I_B$ is the base current. Thus, the transistor design shown in FIGS. 1 and 2 imposes a tradeoff between the base resistance and the current gain $\beta$.

Other structures for lateral bipolar transistors in SOI have been proposed in order to reduce the base resistance. For example, reference is made to M. Chan et al.: "A High Performance Lateral Bipolar Transistor from a SOI CMOS Process", Proc. 1995 IEEE Intern. SOI Conf., October 1995, pp. 90–91; and G. G. Shahidi et al.: "A Novel High-Performance Lateral Bipolar on SOI", IEDM 1991, pp. 663–666. However, these structures are more complicated and introduce additional process complexity over the simple CMOS process.

It is therefore highly desirable to have a lateral bipolar transistor with improved base resistance, which easily integrates into a CMOS process.

SUMMARY OF THE INVENTION

In one aspect, the present invention provides a semiconductor device comprising a lateral bipolar transistor in a layer of silicon on insulator on a semiconductor substrate. The transistor includes an emitter region, a collector region, and a base region, the base region being confined in a space between the emitter and collector regions and the insulator, and further includes a gate disposed over the base region. Moreover, the semiconductor device comprises a bias line connected to the gate for supplying a bias potential to the gate to generate an accumulation layer in the base region under the gate, thereby reducing a base resistance of the transistor.

In another aspect of the present invention there is provided a semiconductor device comprising a lateral bipolar transistor including an emitter region, a collector region, and a base finger, the emitter and collector regions being arranged at opposite longitudinal sides of the base finger, the transistor further including a base contact positioned on a longitudinal extension of the base finger outside a space between the emitter and collector regions, and further including a gate disposed over the base finger. The semiconductor device additionally comprises a bias line connected to the gate for supplying a bias potential to the gate to generate an accumulation layer in the base finger under the gate, thereby reducing a base resistance of the transistor.

In yet another aspect, the present invention provides a semiconductor device comprising a lateral bipolar transistor including an emitter region, a collector region and a base structure, the base structure comprising a base portion in a space between the emitter and collector regions, the transistor further including a base contact positioned on a surface of the base structure such that a base current flowing in the base structure has a substantial component flowing laterally in the base portion, and further including a gate disposed over the base portion. A bias line is connected to the gate for supplying a bias potential to the gate to generate an accumulation layer in the base portion under the gate, thereby reducing a base resistance of the transistor.

The present invention also provides methods of operating lateral bipolar transistors according to the various aspects indicated above. These methods comprise the step of applying a gate bias potential to generate the accumulation layer.

In one embodiment of the present invention, the lateral bipolar transistor is a npn-type transistor. In this case, the bias potential is a negative potential. In an alternative embodiment, the lateral bipolar transistor is a pnp-type transistor, with the bias potential is a positive potential.

For a high current gain $\beta$ of the lateral bipolar transistor, the emitter region is preferably formed by a heavily doped region, while the collector region is formed of a lightly doped sub-region and a heavily doped sub-region.

Advantageously, the emitter and collector regions and the gate have silicided surfaces, thereby reducing their contact resistance.

BRIEF DESCRIPTION OF THE DRAWINGS

The present invention, its objects, features and advantages may be more fully understood from the following description when read in conjunction with the accompanying drawings, in which.

DESCRIPTION OF THE PREFERRED EMBODIMENTS

Figure 1:
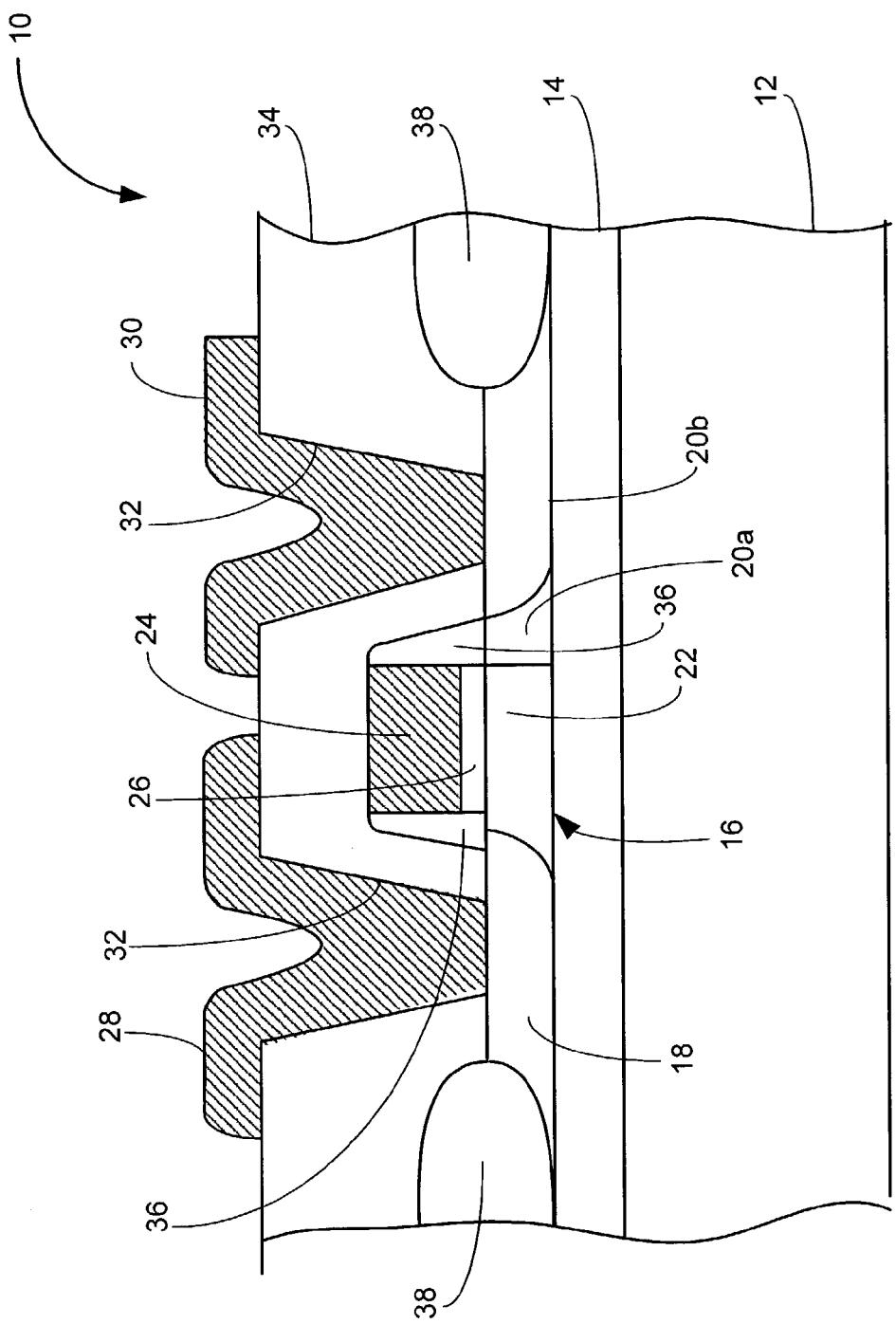
FIG. 1 schematically depicts in cross-sectional view a prior art lateral bipolar transistor fabricated in a CMOS process.
Figure 2:
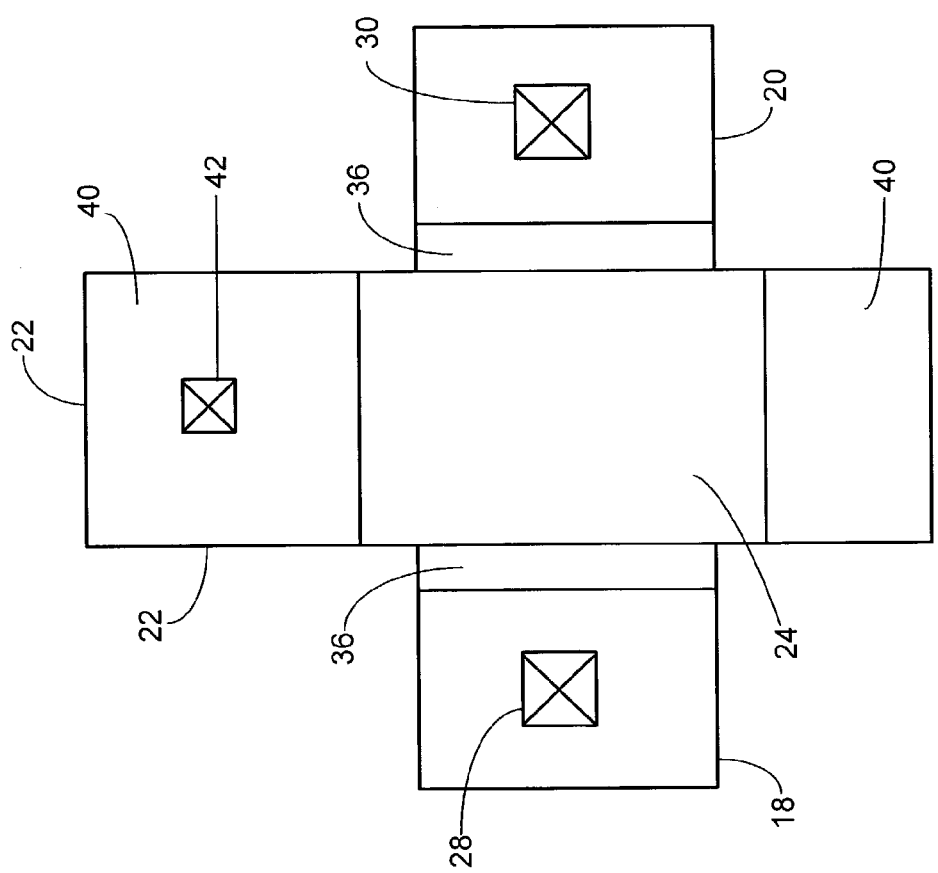
FIG. 2 schematically shows a top view of the transistor of FIG. 1.
Figure 3:
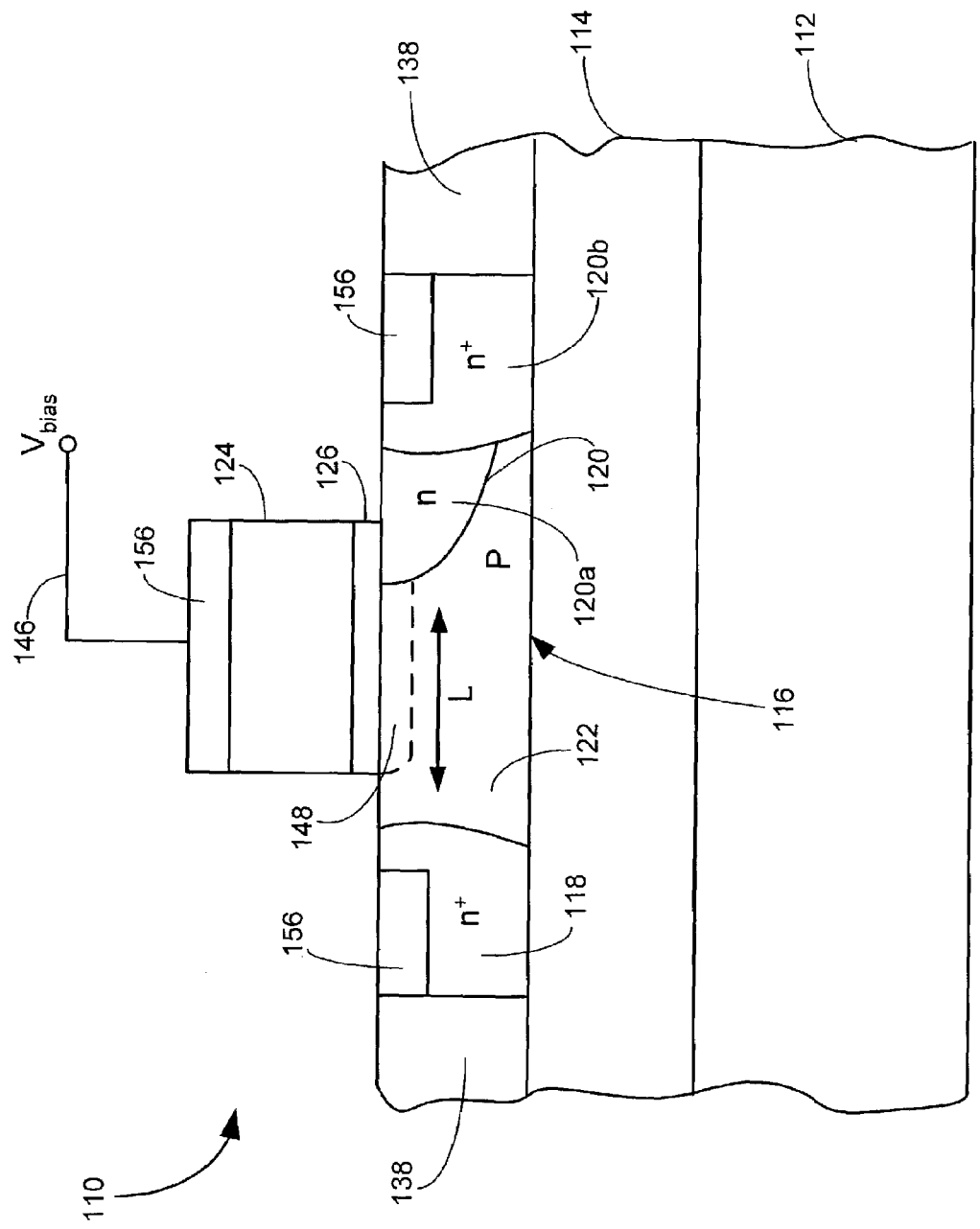
FIG. 3 is a schematic cross-sectional view of a lateral bipolar transistor according to a preferred embodiment of the present invention.
Figure 4:
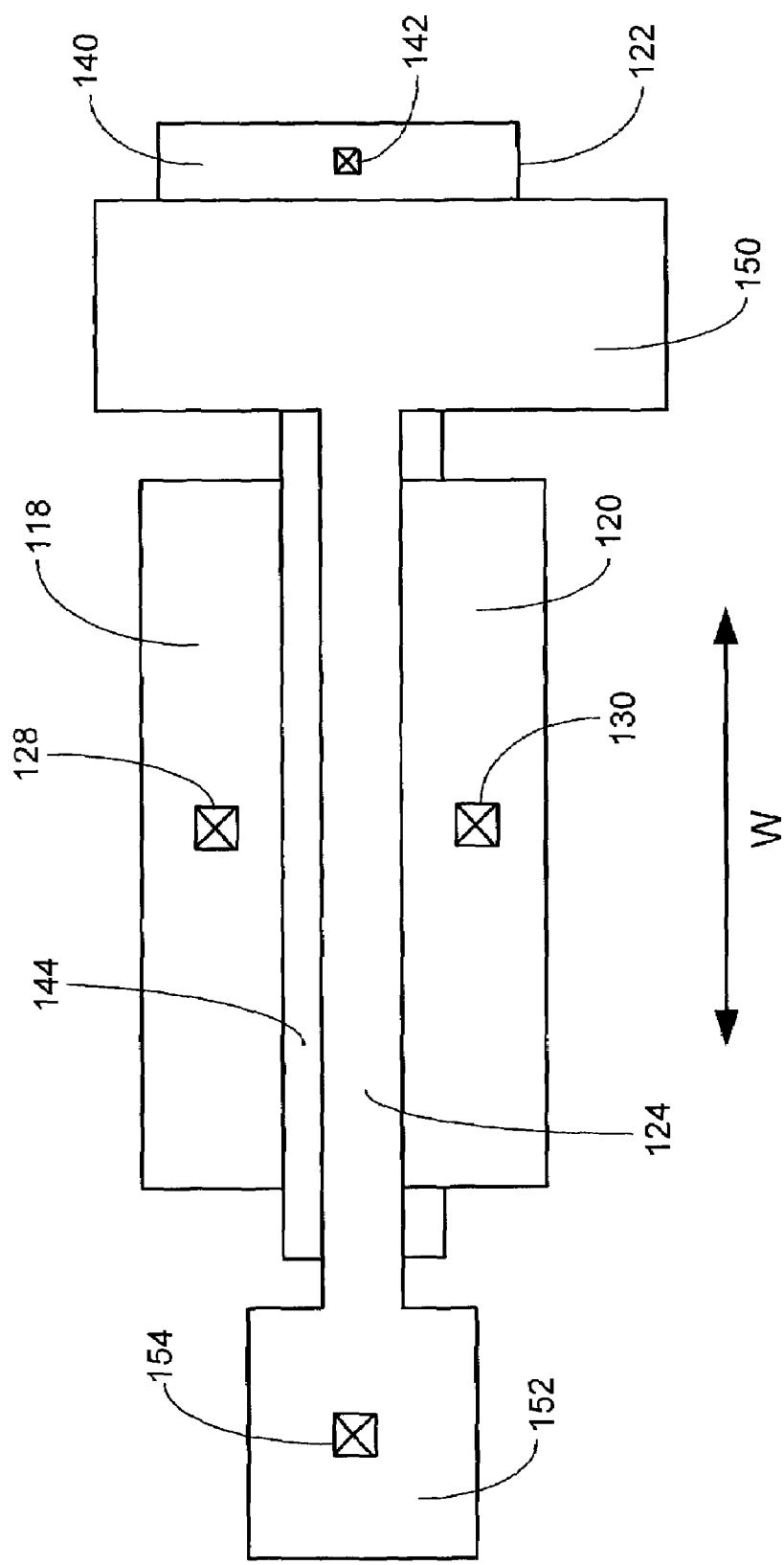
FIG. 4 schematically illustrates the transistor of FIG. 3 when viewed from the top.

FIGS. 1 and 2 have already been described in relation to the prior art. In FIGS. 3 and 4, like or equivalent elements to the elements in FIGS. 1 and 2 are given like reference numerals, increased by 100.

The embodiment shown in FIGS. 3 and 4 features a lateral bipolar transistor 110 of npn type. A person of ordinary skills in the art, however, will easily appreciate that the principles of the present invention may equally be applied to a pnp-type transistor. Transistor 110 is fabricated in SOI technology and comprises a silicon substrate 112, an insulator 114 created in substrate 112 using, e.g., a SIMOX process, and a thin layer of single crystalline silicon 116 on insulator 114. Transistor 110 further comprises an emitter region 118 of n-conductivity type, a collector region 120 of n-conductivity type, and a base region 122 of p-conductivity type formed between emitter region 118 and collector region 120. Emitter region 118, base region 122 and collector region 120 are formed in lateral juxtaposition with each other in silicon layer 116. Emitter region 118 is heavily doped, base region 122 is lightly doped, and collector region 120 is made up of a lightly doped collector sub-region 120a and a heavily doped collector sub-region 120b, with collector sub-region 120a formed between base region 122 and collector sub-region 120b. The high doping of emitter region 118 and the low doping of collector sub-region 120a are advantageous for achieving high emitter efficiency and low collector reverse injection, respectively, resulting in high current gain $\beta$ of transistor 110. As can be easily seen from FIG. 3, emitter region 118 and collector region 120 have a depth such that they extend to insulator 114, confining base region 122 between them.

Base region 122 is overlaid by a polysilicon gate 124, with an insulating oxide layer 126 disposed between base region 122 and gate 124. As in the prior art transistor shown in FIGS. 1 and 2, gate 124 can be useful as a shield during doping of silicon layer 116 to create emitter region 118 and collector region 120. This allows base region 122 to be created with a precisely defined base length. Herein, the term base length refers to the lateral dimension of base region 122 in a direction of distance between emitter region 118 and collector region 120, wherein the term lateral is understood to mean any direction parallel to the surface of silicon layer 116. The direction of the base length is indicated in FIG. 3 by a double-headed arrow designated L. Moreover, a width direction of transistor 110 can be defined as a lateral direction perpendicular to the base length direction L. The width direction is indicated in FIG. 4 by a double-headed arrow referenced W.

In the preferred embodiment described in conjunction with FIGS. 3 and 4, the width in direction W of base region 122 in its portion between emitter and collector regions 118, 120, i.e., the effective width of base region 122, is substantially larger than the length of base region 122 in direction L. Base region 122 can therefore be viewed as a forming a base "finger" in the space between emitter and collector regions 118, 120, which base finger is elongated in direction W and has emitter and collector regions 118, 120 disposed at its opposite longitudinal sides. The finger portion of base region 122 is designated 144 in FIG. 4. A side contact scheme is adopted for contacting base region 122. To this end, finger portion 144 is prolonged in direction W beyond emitter and collector regions 118, 120 by a longitudinal extension forming a base end portion 140, on which there is formed a metal base contact 142.

With the above-described design of transistor 110, a base current having a predominant lateral component flows in base finger 144 when transistor 110 is operated in an active mode, having its emitter-base junction forward-biased and its collector-base junction reverse-biased. Specifically, the base current has a substantial component flowing in longitudinal direction, i.e., in direction W, in base finger 144. In order to reduce the base resistance seen by the base current, in accordance with the present invention a negative bias voltage $V_{bias}$ is applied to gate 124 during operation of transistor 110. The bias voltage, which is applied to gate 124 via a bias line 146 shown in FIG. 3, causes positive charge carriers in base region 122 to accumulate in a surface layer 148 indicated by broken lines in FIG. 3 and located under gate 124. The self-aligned accumulation layer 148 thus formed provides a low-resistance path for the base current, leading to a reduced overall base resistance of base region 122. Generally, $V_{bias}$ may have any voltage level suitable for generating the accumulation layer 148 in base region 122. In a case where transistor 110 is part of an integrated circuit device, such as, e.g., a programmable logic device, a processor or an analogue circuit device, $V_{bias}$ may be derived from, and possibly equal in absolute value to, an operating voltage from which the integrated circuit device is operated.

It will be readily understood by a person skilled in the art that in the case of a pnp-type transistor a bias voltage of opposite polarity, i.e., a positive voltage, will have to be applied to gate 124 in order to achieve the before-mentioned resistance-reduction effect.

The application of a bias voltage to a gate overlying a base in a lateral bipolar transistor has already been suggested in the art, see, e.g., E. A. Vittoz: "*MOS Transistors Operated in the Lateral Bipolar Mode and Their Application in CMOS Technology*", IEEE Journal of Solid-State Circuits, Vol. SC-18, No. 3, June 1983, pp. 273–279; and U.S. Pat. No. 6,081,139. However, while the prior art bias voltage causes the generation of a surface layer of accumulated majority charge carriers in the base under the gate, the sole purpose of this accumulation layer is to push the current flow of diffusing carriers between emitter and collector away from the surface of the base so as to avoid MOS transistor operation and assure bipolar action. The base current flow is through a conducting path under the collector, rather than in the accumulation layer.

As can be seen from FIG. 4, gate 124 has first and second opposite gate end portions 150, 152 protruding beyond emitter and collector regions 118, 120 in direction W. First gate end portion 150 partially overlays base end portion 140, thus prolonging the low-resistance path provided by accumulation layer 148. In this way, the base resistance of transistor 110 can be further reduced. Second gate end portion 152 is provided with a metal gate contact 154 connected to bias line 146 shown in FIG. 3. Additional metal contacts 128, 130 serve for contacting emitter region 118 and collector region 120, respectively. For low contact resistance, emitter region 118, collector sub-region 120*b* and gate 124 are silicided at their surface, thus forming self-aligned silicide layers 156, which can be seen in FIG. 3. Field oxide regions 138 separate transistor 110 from adjacent circuit structures implemented in silicon layer 116. Although not shown, gate 124 may have insulating spacers on its sidewalls, similar to spacers 36 in the prior art device illustrated in FIGS. 1 and 2.

The four-terminal (emitter, base, collector, and gate) lateral bipolar transistor of the present invention can be easily fabricated using a standard CMOS process without adding additional process complexity. Preferred, although not limiting applications of the transistor according to the present invention are in voltage regulator circuits, high-frequency circuits, I/O circuits, voltage reference circuits, etc. A particularly advantageous application of the present invention is in BiCMOS (bipolar complementary metal-oxide-semiconductor) devices, which combine bipolar and CMOS devices on the same integrated circuit chip, thus benefitting from both the high-speed characteristics of bipolar technology and the low-power characteristics of CMOS technology.

While a preferred embodiment of the transistor according to the present invention has been described in detail above, modifications and alterations can be made thereto without departing from the scope of the invention as defined in the accompanying claims. For example, although the transistor of FIGS. 3 and 4 is realized in SOI technology, an embodiment can be envisioned in which the transistor is fabricated in bulk silicon.

What is claimed is:

1. A semiconductor device comprising:
    a lateral bipolar transistor in a layer of silicon on insulator on a semiconductor substrate, said transistor including:
    an emitter region, a collector region, and a base region, said base region being confined in a space between said emitter and collector regions and said insulator,
    a gate disposed over said base region; and
    a bias line connected to said gate for supplying a bias potential to said gate to generate an accumulation layer in said base region under said gate, thereby reducing a base resistance of said transistor.

2. The semiconductor device of claim 1, wherein said lateral bipolar transistor is a npn-type transistor and said bias potential is a negative potential.

3. The semiconductor device of claim 1, wherein said lateral bipolar transistor is a pnp-type transistor and said bias potential is a positive potential.

4. The semiconductor device of claim 1, wherein said emitter region is formed by a heavily doped region.

5. The semiconductor device of claim 1, wherein said collector region comprises a lightly doped sub-region and a heavily doped sub-region.

6. The semiconductor device of claim 1, wherein said emitter and collector regions comprise a surface layer of a silicide.

7. The semiconductor device of claim 1, wherein said gate comprises a surface layer of a silicide.

8. A semiconductor device, comprising:
    a lateral bipolar transistor including:
    an emitter region, a collector region, and a base finger, said emitter and collector regions being arranged at opposite longitudinal sides of said base finger,
    a base contact positioned on a longitudinal extension of said base finger outside a space between said emitter and collector regions,
    a gate disposed over said base finger; and
    a bias line connected to said gate for supplying a bias potential to said gate to generate an accumulation layer in said base finger under said gate, thereby reducing a base resistance of said transistor.

9. The semiconductor device of claim 8, wherein said lateral bipolar transistor is a npn-type transistor and said bias potential is a negative potential.

10. The semiconductor device of claim 8, wherein said lateral bipolar transistor is a pnp-type transistor and said bias potential is a positive potential.

11. The semiconductor device of claim 8, wherein said emitter region is formed by a heavily doped region.

12. The semiconductor device of claim 8, wherein said collector region comprises a lightly doped sub-region and a heavily doped sub-region.

13. The semiconductor device of claim 8, wherein said lateral bipolar transistor is formed in a layer of silicon on insulator on a semiconductor substrate.

14. The semiconductor device of claim 13, wherein said emitter and collector regions extend to said insulator.

15. The semiconductor device of claim 8, wherein said emitter and collector regions comprise a surface layer of a silicide.

16. The semiconductor device of claim 8, wherein said gate comprises a surface layer of a silicide.

17. A semiconductor device, comprising:
    a lateral bipolar transistor including:

an emitter region, a collector region, and a base structure, said base structure comprising a base portion in a space between said emitter and collector regions, a base contact positioned on a surface of said base structure such that a base current flowing in said base structure has a substantial component flowing laterally in said base portion, a gate disposed over said base portion; and a bias line connected to said gate for supplying a bias potential to said gate to generate an accumulation layer in said base portion under said gate, thereby reducing a base resistance of said transistor.

18. The semiconductor device of claim 17, wherein said lateral bipolar transistor is a npn-type transistor and said bias potential is a negative potential.

19. The semiconductor device of claim 17, wherein said lateral bipolar transistor is a pnp-type transistor and said bias potential is a positive potential.

20. The semiconductor device of claim 17, wherein said emitter region is formed by a heavily doped region.

21. The semiconductor device of claim 17, wherein said collector region comprises a lightly doped sub-region and a heavily doped sub-region.

22. The semiconductor device of claim 17, wherein said lateral bipolar transistor is formed in a layer of silicon on insulator on a semiconductor substrate.

23. The semiconductor device of claim 22, wherein said emitter and collector regions extend to said insulator.

24. The semiconductor device of claim 17, wherein said emitter and collector regions comprise a surface layer of a silicide.

25. The semiconductor device of claim 17, wherein said gate comprises a surface layer of a silicide.

* * * * *